United States Patent [19]

Miyata et al.

[11] Patent Number: 4,699,804
[45] Date of Patent: Oct. 13, 1987

[54] PROCESS FOR PRODUCING ELECTRICALLY CONDUCTIVE COMPOSITE POLYMER ARTICLE

[75] Inventors: Seizo Miyata; Takeaki Ozio, both of Tokyo, Japan

[73] Assignee: Hoechst Gosei Kabushiki Kaisha, Tokyo, Japan

[21] Appl. No.: 809,814

[22] Filed: Dec. 17, 1985

[30] Foreign Application Priority Data

Dec. 28, 1984 [JP] Japan ................................ 59-275467
Aug. 2, 1985 [JP] Japan ................................ 60-171600
Aug. 6, 1985 [JP] Japan ................................ 60-173897

[51] Int. Cl.$^4$ .......................... B05D 5/12; B05D 3/14
[52] U.S. Cl. .................................... 437/176; 427/108; 427/255.6; 427/261; 427/302; 427/322; 437/181
[58] Field of Search .............. 427/302, 84, 267, 255.6, 427/322, 108

[56] References Cited

U.S. PATENT DOCUMENTS 3,157,527 11/1964 Fourret ................................ 427/302
3,330,686 7/1967 Rose .................................... 427/302
4,104,438 8/1978 Angelo et al. .................... 427/255.6
4,521,450 6/1985 Bjorklund et al. .................. 427/302

OTHER PUBLICATIONS

M. Salmon, "Journal of Polymer Science: Polymer Letters Edition", vol. 20, 187–193, (1982).
K. C. Khulbe and R. S. Mann, "Journal of Polymer Science: Polymer Chemistry Edition", vol. 20, 1089–1095, (1982).

Primary Examiner—Norman Morgenstern
Assistant Examiner—Janyce A. Bell
Attorney, Agent, or Firm—Armstrong, Nikaido, Marmelstein & Kubovcik

[57] ABSTRACT

A process for producing an electrically conductive composite polymer article, which comprises contacting at least one polymerizable compound selected from the group consisting of heterocyclic compounds, derivatives thereof, aniline and aniline derivatives with a polymer article containing a polymerization catalyst for the polymerizable compound, and polymerizing the polymerizable compound to prepare an electrically conductive polymer on the surface of the polymer article or on the surface and in the polymer article. Schottky-barrier diodes and patterned electrodes can also be produced by utilizing the process. According to the process, process steps can be simplified, and various devices having excellent conductivity and transparency can be produced.

7 Claims, No Drawings

PROCESS FOR PRODUCING ELECTRICALLY CONDUCTIVE COMPOSITE POLYMER ARTICLE

BACKGROUND OF THE INVENTION

The present invention relates to a process for producing a electrically conductive composite polymer article having an excellent electric conductivity and transparency. Process of the present invention is useful for production of Schottky-barrier diodes, and patterned electrodes.

Heretofore, there have been known typical electrically conductive polymers such as polyacetylene, polyparaphenylene, polyphenylene sulfide, polypyrrole and polythiophene. These polymers are utilized as p-type or n-type conductors by selecting dopants, and also as metallic conductors.

Examples of the use of the conductive polymers are, for instance, electrodes, cells, batteries, semiconductor elements, solar cells, shielding materials for electromagnetic waves, antistatic agents, and the like. In case of using the polymers for those uses, however, there is a defect that the polymers are difficult to process because they are insoluble and non-melting, and also there is a practical obstruction because the synthesized films form in polymers are opaque.

Polypyrroles are particularly attractive conductive polymers since they have a high conductivity and a stability in air. As is described in Gardini. Adv. Heterocycl. Chem., 15, 67 (1973), however, a polypyrrole so-called "pyrrole black" prepared by oxidizing pyrrole with, for instance, hydroperoxide in an acid solution is a powder material. Further in order to enhance its conductivity it is necessary to dope it with an electron acceptor such as a halogen atom or an electron donor such as an alkali after the preparation. In addition a molded article obtained by compression molding of the powder is brittle and opaque.

There has been also known an electrochemical polymerization by employing platinum or gold as an anode, as described in A. F. Diaz and K. K. Kanazawa, J.C.C.S. Chem. Comm. 1979, 635. According to this method, however, since an insoluble and non-melting polypyrrole is deposited on the anode surface, it is impossible to produce an article having a desired shape from the obtained polymer film because it is insoluble and non-melting. Thus, the polymer film peeled off the anode is usually used as it is.

As mentioned above, according to the prior methods the product has a poor utility because a desired shape cannot be obtained, and also the highly conductive product is black and opaque, and has a transmittance of not more than 1%. Accordingly even if coating with a transparent resin for preventing light scattering due to irregularity of the surface of the film, the light transmittance cannot be improved.

There have been known several processes for preparing Schottky-barrier diodes by employing electrically conductive polymer articles. For instance, Schottky-barrier diodes using polyacetylene as a conductive polymer material are disclosed in, for example, Japanese Unexamined Patent Publication (Tokkyo Kokai) Nos. 146284/1980, 129370/1981, 147486/1981 and 147687/1981, and the diodes using polypyrrole are described in, for example, Japanese Unexamined Patent Publication (Tokkyo Kokai) No. 63759/1984.

Polyacetylene, however, has defects that it is very unstable to oxygen or moisture and that it is degraded with the lapse of time. Accordingly Schottky-barrier devices of polyacetylene must be used in an oxygen and moisture free system. Also Shottky-barrier devices of polypyrroles have defects that processability of the devices is bad and that electric conductors having a large area cannot be obtained because only the electrochemical polymerization is known as a preparation method of the polypyrrole.

Heretofore, patterned electrodes have been prepared by applying photoresists such as photosensitive resins to insulating substrates coated with conductive materials such as copper, gold, indium oxide and tin oxide, irradiating ultraviolet rays to the photoresists through a photomask having a desired pattern to cure the photoresists, removing the non-cured portion of the photoresists, and then forming electric circuits by chemical etching. The process steps, however, are very complicated.

As mentioned hereinabove, pyrrole or an N-substituted pyrrole which is a heterocyclic compound can provide a highly electrically conductive polymer. However, since polymerization can be conducted only by the electrochemical polymerization, it is impossible to form a patterned circuit of the polypyrrole or poly-N-substituted-pyrrole on an insulating substrate.

An object of the invention is to provide an improved process for producing an electrically conductive composite polymer article having an excellent electric conductivity.

Another object of the invention is to provide a process for producing a Schottky-barrier diode having an excellent property and a desired area by employing the process of the production of the electrically conductive composite polymer article.

The other object of the invention is to provide a simple process for producing a patterned electrode by employing the process of the production of the electrically conductive composite polymer article.

SUMMARY OF THE INVENTION

As a result of the inventors' intensive study for solving the above-mentioned disadvantages, it has been found that a highly electrically conductive composite polymer article can be obtained without doping treatment by contacting a polymer article which contains a polymerization catalyst(hereinafter referred to as "catalyst-containing polymer article")with a heterocyclic compound such as pyrrole or pyrrole derivatives, aniline or aniline derivatives in vapour state or liquid state to prepare a polypyrrole or the like on the surface of the article or on the surface and in the article, and then the present invention has been completed.

According to the present invention, there is provided a process for producing an electrically conductive composite polymer article, which comprises contacting at least one polymerizable compound selected from the group consisting of heterocyclic compounds, derivatives thereof, aniline and aniline derivatives with a polymer article which contains a polymerization catalyst for the polymerizable compound, and polymerizing the polymerizable compound to produce an electrically conductive polymer on the surface of the catalyst-containing polymer article or on the surface and in the catalyst-containing polymer article.

The electrically conductive composite polymer article produced by the process of the invention has a high electrical conductivity without doping treatment, and an excellent transparency and a good processability.

According to the present invention, there is also provided a process for producing a Schottky-barrier diode, which comprises a step wherein an electrically conductive composite polymer article is produced by contacting at least one polymerizable compound selected from the group consisting of heterocyclic compounds, derivatives thereof, aniline and aniline derivatives with a polymer article which contains a polymerization catalyst for the polymerizable compound, and polymerizing the polymerizable compound to prepare an electrically conductive polymer on the surface of the catalyst-containing polymer article or on the surface and in the catalyst-containing polymer article, and a step wherein a Schottky-barrier contact is formed on the electrically conductive composite polymer article.

According to the process, the process steps can be simplified and a Schottky-barrier diode having an excellent rectification property and a large area can be easily produced.

According to the present invention, there is further provided a process for producing a patterned electrode, which comprises contacting at least one polymerizable compound selected from the group consisting of heterocyclic compounds, derivatives thereof, aniline and aniline derivatives with an insulating substrate on which a desired pattern of a polymer containing a polymerization catalyst for the polymerizable compound is formed, and polymerizing the polymerizable compound to prepare an electrically conductive polymer in the pattern.

The process of the present invention can easily provide a patterned electrode.

DETAILED DESCRIPTION

In the following, the process for producing an electrically conductive composite polymer article (hereinafter referred to as "conductive composite article") is explained, and then the process for production of a Schottky-barrier diode and the process for production of a patterned electrode by employing the process for production of the conductive composite article are explained.

The polymerizable compound used in the present invention is at least one compound selected from the group consisting of heterocyclic compounds, derivatives thereof, aniline and aniline derivatives. Examples of the heterocyclic compounds and the derivatives thereof are, for instance, pyrrole, pyrrole derivatives, and the like. Examples of the pyrrole derivatives and the aniline derivatives are, for instance, N-alkylpyrrole such as N-methylpyrrole and N-ethylpyrrole, N-alkylaniline such as N-dimethylaniline. Particularly preferable polymerizable compounds are pyrrole and aniline. These compounds may be polymerized alone on in an admixture thereof.

As the polymerization catalyst for the polymerizable compound, there are employed metal salts such as ferric chloride, cupric chloride and cupric sulfate; metal oxides such as lead dioxide; peroxo acid salts such as potassium persulfate and ammonium persulfate; quinones such as benzoquinone; diazonium salts such as benzenediazonium chloride; potassium ferricyanide; hexachloroplatinate (IV); and the like.

Examples of the polymer to which the polymerization catalyst is added are, for instance, organic synthetic polymer such as polyvinyl acetal, polycarbonate, polyvinyl butyral, polyacrylate, polymethacrylate, polymethyl methacrylate, polyethylene, polypropylene, polystyrene, polyacrilonitrile, polyvinyl acetate, polyvinyl chloride, polyvinilidene chloride, polyvinyl fluoride, polyvinylidene fluoride, polyvinylidene cyanide, polybutadiene, polyisoprene, polyether, polyester, polyamide, polyimide, silicone, polyvinyl alcohol, polyvinyl pyrrolidone, polyacrylamide and polyethylene glycol; derivatives thereof; and the like. The polymers include copolymers such as styrene-acrylate copolymer, vinyl acetate-acrylate copolymer and ethylene-vinyl acetate copolymer. Also, included are natural polymer such as cellulose, starch, casein and natural rubber; semisynthetic high molecular compounds such as cellulose derivatives, e.g. methyl cellulose, hydroxyethyl cellulose and carboxymethyl cellulose; inorganic polymer such as glass, silica and alumina.

The article of the polymer can be used in various forms and shapes such as powder, particle, film, sheet, plate, yarn, rod, pipe, fiber, paper, woven fabric and non-woven fabric. In addition, various previously-shaped articles such as electric or electronic parts or devices, mechanical parts or devices and casings can also be employed.

To the article of the polymer, the polymerization catalyst is previously added or introduced. The addition of the catalyst may be carried out before molding the polymer, or may be carried out by immersion method or coating method after the molding.

For example, the catalyst-containing polymer article can be molded by admixing an aqueous solution, aqueous emulsion, sol or organic solution of the polymer with an aqueous solution or organic solution of the polymerization catalyst, and then casting or spinning the mixture.

The mixture may be applied to an optionally shaped article such as plastic film or paper with a coater, or may be applied to an optionally shaped article of metal, ceramics or plastics by means of spray-coating method. The latter method is advantagous when a highly electrically conductive film is formed on an article having a complicated shape. When adhesive property between the film and the optionally shaped article is bad, the adhesive property can be improved by subjecting the article to surface treatment such as corona discharge treatment, chemical etching treatment or anchorcoating treatment with urethane resins.

In addition, the polymerization catalyst can be added or introduced to such an article as paper, fiber, woven fabric, non-woven fabric or plate by coating an aqueous or organic solution of the catalyst or by immersing into the solution.

The solids content of the catalyst is preferably 1 to 80% (% by weight, hereinafter the same) on the basis of the polymer. In view of strength of the article, a preferable solids content of the catalyst is not more than 50%.

The polymerization of the polymerizable compound such as the above-mentioned heterocyclic compounds, the derivatives thereof, aniline and the aniline derivatives are carried out by contacting the compound with the catalyst-containing polymer article.

The polymerizable compound is polymerized in the presence of the catalyst contained in the catalyst-containing polymer article to form an electrically conductive polymer on the surface or on and in the catalyst-containing polymer article.

The polymerization can be achieved in various manners. One of them is a vapor state polymerization method.

The vapor state polymerization reaction is conducted in closed system. Namely, the polymerization is carried out only by allowing the catalyst-containing polymer article to stand in a sealed atmosphere where one or more of the polymerizable compounds are placed. Alternatively, the catalyst-containing polymer article may be allowed to stand in an atmosphere where the polymerizable compound is forced to circulate.

The polymerization temperature is preferably low in order to obtain a polymer having a high conductivity and light transmittance. For example, even if the polymerization temperature is lower than a melting point of the polymerizable compound, the polymerization can be proceeded because of vapor pressure of the compound. In such a case, the polymerization requires a relatively long time.

The polymerization time should be determined according to various polymerization conditions. For instance, in case of polymerization reaction of pyrrole by using polyvinyl alcohol containing ferric chloride in an amount of 35%, an electrically conductivity of the resulting conductive composite article is saturated for 60 minutes at 60° C. When the polymerization is continued beyond 60 minutes, the electric conductivity and also light transmittance of the conductive composite article becomes lower.

When polymerization of pyrrole is carried out at −40° C. under an ice vapor pressure of 0.8 mmHg by using polyvinyl alcohol which contains ferric chloride in an amount of 50% and water in an amount of 5%, though the polymerization temperature is such a low temperature, polymerization rate is high and an electric conductivity of the resulting conductive composite article is saturated for 60 minutes due to influence of water. In this case, the electric conductivity and light transmittance also becomes lower when the polymerization is continued.

Presence of water vapor in polymerization system and/or water absorption of the catalyst-containing polymer article are advantageous in order to obtain an article having a high electric conductivity and to shorten the polymerization time.

The water vapor can be produced only by placing water or ice in the reaction system. Absorption of water or moisture into the catalyst-containing polymer article can be achieved by allowing the article to stand in a high moisture atmosphere before the polymerization, or by introducing water vapour present in the reaction system into the article during the polymerization.

Water content of the catalyst-containing polymer article varies depending on the kinds of the polymer, and is preferably 1 to 5% in case of water-soluble polymer, and is generally not more than 1% in case of water-insoluble polymer.

According to the vapour state polymerization method, the polymerization process can be carried out in dry state, and thus a conductive composite article can easily be produced, because a drying step for removing unreacted compounds which is required in a wet process such as electrochemical polymerization can be eliminated.

Another polymerization method used in the present invention is a liquid state polymerization method. The liquid state polymerization is carried out by dipping the catalyst-containing polymer article into an organic solution prepared by dissolving one or more of the polymerizable compounds in an organic solvent. As the organic solvent, there can be employed a solvent which can be miscible with or dissolve the polymerizable compound. Preferable solvent is an alcoholic solvent.

The concentration of the polymerizable compound in the solution varies depending on the kinds of the compound, and is, in general, not less than about 10%. When the concentration is lower than 10%, though the polymerization time becomes long, the polymerization can still be carried out. Further, when the compound is liquid, the polymerization can be carried out without solvent.

The polymerization can be carried out at a temperature of not less than a melting point of the solvent or the compound used. For obtaining a conductive composite article having a high conductivity and light transmittance, it is preferable to employ a temperature as low as in the above temperature range.

The liquid state polymerization can also be carried out in a dispersion of the polymerizable compound as in the solvent.

The conductive composite article produced according to the process of the present invention has an excellent conductivity and transparency without doping treatment which is required for other conductive polymers.

According to the present invention, flexibility, processability and shape of the conductive composite article can be freely changed by selecting the kind and/or shape of the catalyst-containing polymer article, and further the resulting conductive composite article has an excellent transparency. Accordingly, practical applications of the process of the invention become wider.

Further, though a conventional conductive article in which carbon powder or metal powder is dispersed is opaque, the conductive composite article prepared by the process of this invention is transparent and is suitable for transparent antistatic packages for IC circuits or other electronic devices and as antistatic materials for clean rooms. Moreover, since the conductive composite article having various shapes can be produced, the conductive composite article can also be used and show excellent effects as electromagnetic wave shielding materials for computer housings, pressure sensitive tapes for electromagnetic wave shields, flexible transparent electrodes, semiconductor devices, and the like.

In the following, the process for producing a Schottky-barrier diode by utilizing the process for production of the electrically conductive composite polymer article is explained.

The Schottky-barrier diode can be produced by bringing the conductive composite article prepared by the above-mentioned process in contact with a metal having a small work function.

The conductive composite article used in the process can be produced by the above-mentioned process. For example, the article can be produced by contacting, in vapor state, one or more polymerizable compounds selected from heterocyclic compounds such as pyrrole or derivatives thereof, e.g. an N-substituted-pyrrole such as N-methylpyrrole, N-ethylpyrrole, N-propyl-pyrrole or N-butylpyrrole; aniline and aniline derivatives with a catalyst-containing polymer article which is molded from a polymer such as polyvinyl alcohol, polyvinyl butyral, polyvinyl acetate, polymethyl-methacrylate, polyvinyl chloride or polyacrylonitrile, which contains a polymerization catalyst for the polymerizable compound, e.g. a metal salt such as ferric chloride, cupric chloride or cupric sulfate; a metal oxide such as lead dioxide; a peroxo acid salt such as potassium persulfate or ammonium persulfate; or the like.

The polymer article containing the catalyst can be prepared by admixing an aqueous solution, emulsion, sol or organic solution of the polymer with an aqueous or organic solution of the catalyst and molding the mixture by means of casting method or the like, or by coating the previously molded polymer article not containing the catalyst with the mixture, or by immersing the previously molded polymer article not containing the catalyst into the mixture.

The Schottky-barrier diode is produced by contacting or coating the conductive composite article with a metal having a small work function by means of vapor deposition method, sputtering method, chemical vaper deposition (CVD) method, electroplating method, and the like. Examples of the metal having a small work function are, for instance, indium, gallium, indium-gallium alloy, aluminium, silver, tin, germanium, and the like.

Conventional Schottky-barrier diodes produced by using polyacetylene as described in Japanese Unexamined Patent Publication (Tokkyo Kokai) Nos. 146284/1980, 129370/1981, 147486/1981 and 147687/1981 are extremely unstable against oxygen and moisture, and also degrade with the lapse of time. The Schottky-barrier diode produced by the process of the invention, however, does not have such defects.

Another conventional Schottky-barrier diode produced by electrochemical polymerization of pyrrole as described in Japanese Unexamined Patent Publication (Tokkyo Kokai) No. 63759/1984 has defects that a diode having a large area is difficult to produce, and that, because the electrochemical polymerization is a wet-process, the polymerization reaction is hardly controlled. Further there are problems concerning requirement of a special polymerization vessel, a removing step of unreacted compounds and a drying step of the product. The Schottky-barrier diode produced by the process of the invention, however, does not have such defects.

According to the process of the present invention, a Schottky-barrier diode having a large area can easily be produced by simplified process steps. The resulting Schottky-barrier diode has an excellent rectification property, and has flexibility and processability which are characteristics of organic polymer. Accordingly, the diode is utilized as various electronic parts or devices such as photosensors and photoelectric transfer devices.

In the following, the process for producing a patterned electrode by utilizing the process for production of the electrically conductive composite polymer article is explained by means of preferred embodiment.

A patterned electrode can be produced by forming a desired circuit pattern of a polymer such as polyvinyl alcohol, polyvinyl butyral, polyvinyl acetate, polymethyl methacrylate, polyvinyl chloride or polyacrylonitrile which contains a polymerization catalyst, e.g. a metal salt such as ferric chloride, cupric chloride or cupric sulfate; a metal oxide such as lead dioxide; a peroxo acid salt such as potassium persulfate or ammonium persulfate, on an electrically insulating substrate such as glass plate or polyester film, and then contacting the patterned catalyst-containing polymer on the insulating substrate with a vapor of one or more polymerizable compounds selected from heterocyclic compounds such as pyrrole or derivatives thereof, e.g. an N-substituted-pyrrole such as N-methylpyrrole, N-ethylpyrrole, N-propylpyrrole or N-butylpyrrole; aniline and aniline derivatives to prepare an electrically conductive polymer in the pattern.

The polymer containing the catalyst can be prepared by admixing an aqueous solution, emulsion, sol or organic solution of the polymer with an aqueous or organic solution of the catalyst. The pattern can be formed on the insulating substrate by means of, for instance, screen printing method by using the mixture.

According to the present invention, a patterned electrode having excellent properties can be obtained by only two process steps, that is the process step where a desired pattern of the catalyst-containing polymer is formed on the insulating substrate and the process step where the patterned substrate is contacted with the vapor of the polymerizable compound.

This process of the present invention can eliminate the conventional complicated process steps comprising, for instance, a step for forming an electrically conductive coating on an insulating substrate, a step for coating thereon a photoresist, a step for masking, a step for irradiating, for instance, an ultraviolet ray, a step for removing uncured portion, a step for chemical etching and a step for removing cured portion.

The present invention is more specifically described and explained by means of the following Examples and Comparative Examples. It is to be understood that the present invention is not limited to the Examples and various changes and modifications may be made in the invention without departing from the spirit and scope thereof.

Examples 1 to 20 and Comparative Examples 1 to 2 are used for explaining the process for producing the conductive composite article, and Examples 21 to 23 and Examples 24 to 25 are used for explaining the process for producing the Schottky-barrier diode and the process for producing the patterned electrode, respectively.

In the Examples, part and % are part by weight and % by weight, respectively, unless otherwise noted. Values of the electric conductivity ($\sigma$) was measured by the fourprobe technique in a range of $\sigma > 10^{-8}$ S/cm, by the two point probe technique in a range of $\sigma < 10^{-9}$ S/cm. The determination of the light transmittance was carried out by using a light having a wave length of 550 nm with due consideration for reflectivity.

EXAMPLE 1

A mixture was prepared by admixing 65 parts of a 5% aqueous solution of polyvinyl alcohol having a polymerization degree of 500 and a conductivity ($\sigma$) of $1 \times 10^{-11}$ S/cm and 35 parts of a 5% aqueous solution of $FeCl_3$. The obtained mixture was coated on a polyester sheet of 100 $\mu$m thick with a bar coater so that the formed film had a thickness of 5 $\mu$m, and dried for 24 hours at 20° C. and at 65% RH to produce a polyvinyl alcohol film containing the polymerization catalyst.

The film was peeled off from the polyester sheet and was cut to prepare a test piece of 100 $cm^2$. The test piece was placed, together with 1 ml of pyrrole and 1 ml of water in a glass desiccator of 0.05 $m^3$ provided with an exhaust valve. After pumping out the air with a rotary pump to reduce the inner pressure, vapor state polymerization was carried out for 60 minutes at $-15°$ C.

The thus obtained film, namely, electrically conductive composite polymer article had a conductivity of 10

S/cm (measured by fourprobe technique under vacuum) and a light transmittance of 50%.

EXAMPLE 2

The vapor state polymerization was carried out in the same manner as in Example 1 except that the polymerization was conducted for 10 minutes and for 24 hours instead of for 60 minutes.

The thus obtained film (polymerization time: 10 min) had a conductivity of $2\times 10^{-1}$ S/cm and a light transmittance of 60%, and the film (polymerization time: 24 hr.) had a conductivity of 12 S/cm and a light transmittance of 45%.

EXAMPLE 3

The vapour state polymerization was carried out in the same manner as in Example 1 except that 1 ml of water was not used.

The thus obtained film had a conductivity of $2\times 10^{-6}$ S/cm and a light transmittance of 65%. The low value of the conductivity was caused by the lack of water. Accordingly, when the polymerization is carried out for 24 hours, the obtained film had an improved conductivity of $3\times 10^{-4}$ S/cm and a light transmittance of 55%.

EXAMPLE 4

The vapor state polymerization was carried out in the same manner as in Example 1 except that the polymerization temperature was $-40°$ C. instead of $-15°$ C.

The thus obtained film had a conductivity of 15 S/cm and a light transmittance of 45%.

EXAMPLE 5

The vapor state polymerization was carried out in the same manner as in Example 1 except that the polymerization temperature was 60° C. instead of $-15°$ C.

The thus obtained film had a conductivity of $5\times 10^{-1}$ S/cm and a light transmittance of 20%. When the polymerization is carried out for 3 hours and for 24 hours, conductivities and light transmittances of the obtained films were $9\times 10^{-2}$ S/cm and 15% (3 hr.), and $1\times 10^{-2}$ S/cm and 13% (24 hr.).

The low values of the light transmittance was caused by low transparency due to the light scattering of the polymer surface which was rough because of the high polymerization temperature.

Accordingly, when the films are coated with a transparent acrylic emulsion at a thickness of 3 μm, the light transmittance was improved to 50% (polymerization time: 60 min.), 45% (3 hr.) and 40% (24 hr.).

EXAMPLE 6

The vapor state polymerization was carried out in the same manner as in Example 1 except that the 5% aqueous solution of polyvinyl alcohol was employed in an amount of 25 parts instead of 65 parts and that the 5% aqueous solution of $FeCl_3$ was employed in an amount of 75 parts instead of 35 parts.

The thus obtained film had a conductivity of 5 S/cm and a light transmittance of 15%. The low value of the transmittance was caused by low transparency due to the light scattering of the polymer surface which was rough because a large amount of the catalyst activating the polymerization.

Accordingly, when the surface of the film is coated with a transparent acrylic emulsion in the same manner as in Example 4, the light transmittance was improved to 45%.

EXAMPLE 7

The vapor state polymerization was carried out in the same manner as in Example 1 except that the 5% aqueous solution of polyvinyl alcohol was employed in an amount of 75 parts instead of 65 parts and that the 5% aqueous solution of $FeCl_3$ was employed in an amount of 25 parts instead of 35 parts.

The thus obtained film had a conductivity of 3 S/cm and a light transmittance of 55%.

When $FeCl_3$ contained in the film is extructed with acetone for 24 hours, the light transmittance was improved to 60%, and the color of the film changed from yellow to pale yellow. The conductivity of the film was slightly reduced to $5\times 10^{-3}$ S/cm.

As in the above procedures, when the remained catalyst in the conductive film is not needed, the catalyst can be extracted with acetone or the like.

EXAMPLE 8

The vapor state polymerization was carried out in the same manner as in Example 1 except that the 5% aqueous solution of polyvinyl alcohol was employed in an amount of 90 parts instead of 65 parts and that the 5% aqueous solution of $FeCl_3$ was employed in an amount of 10 parts instead of 35 parts.

The thus obtained film had a conductivity of $3\times 10^{-4}$ S/cm and a light transmittance of 60%.

EXAMPLE 9

The vapor state polymerization was carried out in the same manner as in Example 1 except that 65 parts of a 5% acetone solution of polyvinyl butyral having a polymerization degree of 500 and a conductivity of $3\times 10^{-15}$ S/cm was employed instead of 65 parts of the 5% aqueous solution of polyvinyl alcohol having a polymerization degree of 500 and a conductivity of $1\times 10^{-11}$ S/cm and that 35 parts of a 5% acetone solution of $FeCl_3$ was employed instead of 35 parts of the 5% aqueous solution of $FeCl_3$.

The thus obtained film had a conductivity of $1.2\times 10^{-1}$ S/cm and a light transmittance of 30%.

EXAMPLE 10

The vapor state polymerization was carried out in the same manner as in Example 1 except that 65 parts of a 5% dichloromethane solution of polycarbonate having a polymerization degree of 1000 and a conductivity of $2\times 10^{-16}$ S/cm was employed instead of 65 parts of the 5% aqueous solution of polyvinyl alcohol having a polymerization degree of 500 and a conductivity of $1\times 10^{-11}$ S/cm and that 35 parts of a 5% dichloromethane solution of $FeCl_3$ was employed instead of 35 parts of the 5% aqueous solution of $FeCl_3$.

The thus obtained film had a conductivity of $3\times 10^{-3}$ S/cm and a light transmittance of 40%.

EXAMPLE 11

The vapor state polymerization was carried out in the same manner as in Example 1 except that 65 parts of a 5% acetone solution of polystyrene having a polymerization degree of 1000 and a conductivity of $5\times 10^{-16}$ S/cm was employed instead of 65 parts of the 5% aqueous solution of polyvinyl alcohol having a polymerization degree of 500 and conductivity of $1\times 10^{-11}$ S/cm and that 35 parts of a 5% acetone solution of $FeCl_3$ was employed instead of 35 parts of the 5% aqueous solution of FeCl$_3$.

The thus obtained film had a conductivity of $5 \times 10^{-3}$ S/cm and a light transmittance of 30%.

EXAMPLE 12

The vapor state polymerization was carried out in the same manner as in Example 1 except that 65 parts of a 5% acetone solution of polymethyl methacrylate having a polymerization degree of 1000 and a conductivity of $1 \times 10^{-16}$ S/cm was employed instead of 65 parts of the 5% aqueous solution of polyvinyl alcohol having a polymerization degree owas employed instead of 65 parts of the 5% aqueous solution of polyvinyl alcohol having a polymerization degree of 500 and a conductivity of $1 \times 10^{-11}$ S/cm and that 35 parts of a 5% acetone solution of FeCl$_3$ was employed instead of 35 parts of the 5% aqueous solution of FeCl$_3$.

The thus obtained film had a conductivity of $1 \times 10^{-3}$ S/cm and a light transmittance of 30%.

EXAMPLE 13

The vapor state polymerization was carried out in the same manner as in Example 1 except that 65 parts of a 5% aqueous solution of polyacrylamide having a polymerization degree of 500 and a conductivity of $2 \times 10^{-11}$ S/cm was employed instead of 65 parts of the 5% aqueous solution of polyvinyl alcohol having a polymerization degree of 500 and a conductivity of $1 \times 10^{-11}$ S/cm.

The thus obtained film had a conductivity of 2 S/cm and a light transmittance of 55%.

EXAMPLE 14

The vapor state polymerization was carried out in the same manner as in Example 1 except that 65 parts of a 5% aqueous solution of ethylene-vinyl acetate copolymer emulsion (ethylene : vinyl acetate=2:8, molar ratio) having a polymerization degree of 4000 and a conductivity of $3 \times 10^{-12}$ S/cm was employed instead of 65 parts of the 5% aqueous solution of polyvinyl alcohol having a polymerization degree of 500 and a conductivity of $1 \times 10^{-11}$ S/cm.

The thus obtained film had a conductivity of 3 S/cm and a light transmittance of 20%. Since the film of the emulsion had a low transmittance due to the light scattering, the surface of the film was coated in the same manner as in Example 4 to obtain a film having an improved light transmittance of 40%.

EXAMPLE 15

A wood free paper of 60 μm thick was dipped into a 5% aqueous solution of FeCl$_3$. After pressing the dipped paper with a mangle so that a FeCl$_3$ content in the paper was 20%, the pressed paper was dried for 24 hours at 65% RH, and then was cut to prepare a sample of 100 cm$^2$. The sample, 1 ml of pyrrole and 1 ml of water were placed in a glass desiccator of 0.05 m$^3$ with an exhaust valve, and vapor state polymerization was carried out in the same manner as in Example 1.

The thus obtained wood free paper had a conductivity of $3 \times 10^{-1}$ S/cm.

EXAMPLE 16

The vapor state polymerization was carried out in the same manner as in Example 1 except that the polymerization was conducted for 24 hours at 20° C. instead of for 60 minutes at −15° C.

The thus obtained film had a conductivity of 3 S/cm and a light transmittance of 5%.

The low transmittance was caused by low transparency due to the light scattering of the surface of the polymer which was rough because of the high polymerization temperature.

Accordingly, when the surface of the film was coated with a transparent acrylic emulsion at a thickness of 3 μm, the light tranmsittance was increased to 45%.

EXAMPLE 17

A mixture was prepared by admixing 70 parts of a 5% aqueous solution of polyvinyl alcohol having a polymerization degree of 500 and a conductivity of $1 \times 10^{-11}$ S/cm and 30 parts of a 5% aqueous solution of FeCl$_3$. The obtained mixture was coated on a polyester sheet of 100 μm thick with a bar coater so that the formed film had a thickness of 3 μm, and then dried at a room temperature to obtain a catalyst-containing polyvinyl alcohol film. The film was cut together with the polyester sheet to prepare a sample of 100 cm$^2$. The sample was dipped into 100 ml of a mixed solution of pyrrole and methanol (80:20, weight ratio), and then liquid state polymerization was carried out for 3 hours at 0° C.

The thus obtained film had a conductivity of $1 \times 10^{-1}$ S/cm and a light transmittance of 70%.

EXAMPLE 18

The liquid state polymerization was carried out in the same manner as in Example 17 except that the polymerization was conducted for 30 minutes and for 24 hours instead of for 3 hours.

The conductivities and the light transmittances of the thus obtained films were $2 \times 10^{-4}$ S/cm and 60% (30 min.), and $5 \times 10^{-1}$ S/cm and 40% (24 hr.), respectivily.

EXAMPLE 19

A mixture was prepared by admixing 70 parts of a 5% aqueous solution of polyvinyl alcohol having a polymerization degree of 500 and a conductivity of $1 \times 10^{-11}$ S/cm and 30 parts of a 5% aqueous solution of FeCl$_3$. The obtained mixture was coated on a polyester sheet of 100 μm thick with a bar coater so that the formed film had a thickness of 3 μm, and then dried at a room temperature to obtain a catalyst-containing polyvinyl alcohol film. The film was cut together with the polyester sheet to prepare a sample of 100 cm$^2$. The sample was dipped into 100 ml of a mixed solution of pyrrole, methanol and water (85:10:5, weight ratio), and then liquid state polymerization was carried out for 3 hours at 20° C.

The thus obtained film had a conductivity of $2 \times 10^{-1}$ S/cm and a light transmittance of 40%.

EXAMPLE 20

The liquid state polymerization was carried out in the same manner as in Example 19 except that the polymerization was conducted for 30 minutes and for 24 hours instead of 3 hours.

The conductivities and the light transmittances of the thus obtained films were $3 \times 10^{-4}$ S/cm and 50% (30 min.), and $1 \times 10^{-2}$ S/cm and 30% (24 hr.).

EXAMPLE 21

The vapor state polymerization was carried out in the same manner as in Example 1 except that 1 ml of N-methylpyrrole was employed instead of 1 ml of pyrrole.

The thus obtained film had a conductivity of $5 \times 10^{-1}$ S/cm and a light transmittance of 60%.

EXAMPLE 22

The vapor state polymerization was carried out in the same manner as in Example 1 except that 1 ml of 3-methylpyrrole was employed instead of 1 ml of pyrrole.

The thus obtained film had a conductivity of $8 \times 10^{-1}$ S/cm and a light transmittance of 55%.

EXAMPLE 23

The vapor state polymerization was carried out in the same manner as in Example 1 except that 35 parts of a 5% aqueous solution of potassium persulfate was employed instead of 35 parts of the 5% aqueous solution of $FeCl_3$ and that 1 ml of aniline was employed instead of 1 ml of pyrrole.

The thus obtained film had a conductivity of $2 \times 10^{-1}$ S/cm and a light transmittance of 65%.

COMPARATIVE EXAMPLE 1

The vapor state polymerization was carried out in the same manner as in Example 1 except that 35 parts of the 5% aqueous solution of $FeCl_3$ was not used.

The thus obtained film had a conductivity of $1 \times 10^{-11}$ S/cm which was the same value as that before the polymerization.

COMPARATIVE EXAMPLE 2

The vapor state polymerization was carried out in the same manner as in Example 10 except that 35 parts of the 5% acetone solution of $FeCl_3$ was not used and that 1 ml of aniline was employed instead of 1 ml of pyrrole.

The thus obtained film had a conductivity of $2 \times 10^{-16}$ S/cm which was the same value as that before the polymerization.

EXAMPLE 24

A mixture prepared by admixing 80 parts of a 10% aqueous solution of polyvinyl alcohol and 20 parts of a 10% aqueous solution of ferric chloride was cast on an electrode (10 cm × 10 cm × 2000 A) which was prepared by vacuum-depositing gold (Au) on a glass plate so that a thickness of the formed film was 1 μm.

The electrode on the glass plate, 1 ml of pyrrole and 1 ml of water were placed in a glass desiccator of 0.05 m$^3$ provided with an exhaust valve. After pumping out the air with a rotary pump to reduce the inner pressure, vapor state polymerization was carried out for 3 hours at $-15°$ C. to prepare a thin film of a conductive composite polymer of polypyrrole-polyvinyl alcohol on the electrode.

Then an aluminium electrode (electrode area: 0.25 cm$^2$) was deposited on the film by means deposition method to obtain a Schottky-barrier diode.

The rectification property of the obtained Schottky-barrier diode was measured. The rectification ratio at ±0.5 V was 50.

EXAMPLE 25

A Schottky-barrier diode was produced in the same manner as in Example 24 except that N-methylpyrrole was employed instead of pyrrole and that the polymerization was conducted for 24 hours instead of for 3 hours.

The thus obtained device had a rectification ratio at ±0.5 V of 55.

EXAMPLE 26

The thin film of polypyrrole-polyvinyl alcohol prepared on the glass plate according to the procedures of Example 24 was compensated by a 28% ammonia solution which was a reducing agent, and then dried. After that, the same procedures of Example 24 were repeated to obtain a Schottky-barrier diode.

The thus obtained device had a rectification ratio at ±0.5 V of 60.

EXAMPLE 27

A circuit pattern (dry thickness: 10 μm) was printed and dried on a glass plate (100 mm × 100 mm × 1 mm) by using a polymer solution consisting of ferric chloride, polyvinyl alcohol and water (2:8:90, weight ratio).

The circuit pattern on the glass plate, 1 ml of water and 1 ml of pyrrole were placed in a desiccator. While exhausting with a rotary pump and reducing the inner pressure, polymerization was carried out for 1 hour at 20° C. to convert the circuit pattern to a conductive composite polymer of polypyrrole-polyvinyl alcohol, and then the patterned electrode was produced.

EXAMPLE 28

A circuit pattern (dry thickness: 20 μm) was formed on a polyester film of 0.2 mm thick which was coated with an anchor coating layer by using a polymer solution consisting of ferric chloride, butyl acrylate-methyl methacrylate copolymer and acetone (10:40:50, weight ratio).

The circuit pattern on the polyester film, 1 ml of water and 1 ml of N-methylpyrrole were placed in a desiccator. While exhausting with a rotary pump and reducing the inner pressure, polymerization was carried out for 2 hours at 20° C. to convert the circuit pattern to a conductive composite polymer of N-methylpyrrole-BA-HMA copolymer, and then the patterned electrode was produced.

What we claim is:

1. A process for producing a transparent electrically conductive composite polymer article, which comprises contacting a polymerizable compound with a catalyst-containing transparent polymer article, and polymerizing the polyerizable compound to prepare an electrically conductive polymer on at least the surface of the polymer article;

said polymerizable compound being selected from the group consisting of pyrrole, pyrrole derivatives, aniline and aniline derivatives; and said catalyst-containing polymer article being prepared by casting a solution comprising a polymer which form a transparent article and a polymerization catalyst for the polymerizable compound.

2. The process of claim 1, wherein the pyrrole derivative is an N-alkylpyrrole.

3. The process of claim 1, wherein the aniline derivative is a member selected from the group consisting of an N-alkylaniline and an N-dialkylaniline.

4. The process of claim 1, wherein the polymerization is vapor state polymerization.

5. The process of claim 1, wherein the polymerization is liquid state polymerization.

6. A process for producing a Schottky-barrier diode, which comprises:

a step wherein a transparent, electrically conductive composite polymer article is produced by contacting a polymerizable compound with a catalyst-containing transparent polymer article, and polymerizing the polymerizable compound to prepare an electrically conductive polymer on at least the surface of the polymer article; and a step wherein a Schottky-barrier contact is formed on the transparent electrically conductive composite polymer article;

said polymerizable compound being at least one selected from the group consisting of pyrrole, pyrrole derivatives, aniline and aniline derivatives; and said catalyst-containing polymer article being prepared by casting a solution comprising a polymer which forms a transparent article and a polymerization catalyst for the polymerization compound.

7. A process for producing a patterned electrode, which comprises contacting a polymerizable compound with a patterned insulating substrate, and polymerizing the polymerizable compound to prepare a transparent electrically conductive polymer in the pattern;

said polymerizable compound being at least one member selected from the group consisting of pyrrole, pyrrole derivatives, aniline and aniline derivatives; and said patterned insulating substrate being prepared by forming a pattern on an insulating substrate by using a solution comprising a polymer which forms a transparent article which a polymerization catalyst for the polymerizable compound.

* * * * *